United States Patent [19]

Bohac, Jr.

[11] Patent Number: 4,571,704
[45] Date of Patent: Feb. 18, 1986

[54] NONVOLATILE LATCH

[75] Inventor: Frank J. Bohac, Jr., Laguna Hills, Calif.

[73] Assignee: Hughes Aircraft Company, El Segundo, Calif.

[21] Appl. No.: 581,482

[22] Filed: Feb. 17, 1984

[51] Int. Cl.$^4$ ............................................. G11C 11/40
[52] U.S. Cl. ..................................... 365/156; 365/185
[58] Field of Search ............... 365/154, 156, 174, 185, 365/190

[56] References Cited

U.S. PATENT DOCUMENTS

| 3,618,053 | 11/1971 | Hudson et al. | 365/187 |
| 4,103,348 | 7/1978 | Fagan | 365/228 |
| 4,132,904 | 1/1979 | Harari | 365/185 X |
| 4,185,319 | 1/1980 | Stewart | 365/185 |
| 4,207,615 | 6/1980 | Mar | 365/154 X |
| 4,228,527 | 10/1980 | Gerber et al. | 365/185 |
| 4,342,101 | 7/1982 | Edwards | 365/154 |
| 4,357,685 | 11/1982 | Daniele et al. | 365/185 X |
| 4,363,110 | 12/1982 | Kalter et al. | 365/185 X |
| 4,387,444 | 6/1983 | Edwards | 365/156 |
| 4,403,306 | 9/1983 | Tokushige et al. | 365/156 |
| 4,408,303 | 10/1983 | Guterman et al. | 365/185 X |
| 4,467,451 | 8/1984 | Moyer | 365/156 |

Primary Examiner—Joseph A. Popek
Attorney, Agent, or Firm—Paul M. Coble; A. W. Karambelas

[57] ABSTRACT

A bistable latch circuit is disclosed which can be electrically programmed to be stable in only one of its two states so that this same state is always set when power is applied to the circuit. The circuit can be electrically reprogrammed at will to select either of its stable states, and it draws no dc current during either the program mode or read mode. During the read mode, the potentials on the circuit nodes are such that long data retention times are achieved.

11 Claims, 4 Drawing Figures

NONVOLATILE LATCH

The Governmant has rights in this invention pursuant to Contract No. DAAK20-81-C-0412 awarded by the Department of the Army.

BACKGROUND OF THE INVENTION

1. Field of the Invention

The present invention relates to semiconductor memory units, and more particularly to electronically programmable nonvolatile memory units.

2. Description of the Prior Art

Electronically erasable programmable read only memories (EEPROMS) are presently being fabricated with redundant memory locations, e.g., rows or columns, to realize an improvement in yield. Defective locations may be corrected by replacement with available redundant locations. In order that the corrections are made in a permanent manner, it is necessary that the locations of the defects or errors be stored by a nonvolatile technique, i.e., the information will be retained when power is no longer applied to the memory.

At least two existing techniques for nonvolatile storage of error locations are known. Each technique involves the separation of conductive links or fuses at appropriate locations in the memory device to permanently store the data. One technique, known as the laser link technique, involves the use of an impinging laser beam to selectively separate the fuses. A disadvantage of this technique is that it requires a substantial investment in capital equipment to implement. Another technique, known as the fusable link technique, involves burnout of a fuse by passing a relatively large current through the link. A disadvantage of this technique is that it makes inefficient usage of chip area, since substantial chip area is needed for the devices required to "blow" the fuses. Both of these techniques draw dc current unless two fuses are used per bit, making them less attractive for use with CMOS circuits.

U.S. Pat. No. 4,403,306 (Tokushige et al.) discloses a semiconductor memory operable as a static RAM or EAROM. In the EAROM operation a nonvolatile memory is provided. Nonvolatile data is stored by utilizing the hysteresis characteristics of a threshold voltage $V_{TL}$ of a pair of N-MNOS (N-metal nitride-oxide-silicone) transistors. One of the transistors operates as a depletion mode transistor (having a negative threshold voltage) which conducts when its gate voltage is 0 volts, while the other transistor operates as an enhancement mode transistor (having a positive threshold voltage) which is nonconductive when its gate voltage is 0 volts. The memory unit has a nominal supply voltage of +5 volts, and separate erase and write pulses of −28 volts and +28 volts, respectively, are required to erase and write nonvolatile data.

The cell count of the Tokushige et al. memory unit is relatively large, with eight transistors and two diodes comprising the cell. Since the diodes are forward biased when the unit is operating as a RAM, the diodes should be isolated separately from the other substrates. This increases the complexity of fabrication of the cell, and would at least require another mask to obtain the isolation. Since the cell voltage swing from its high to its low state is from 0 volts to ($V_{CC}$ minus the diode voltage drop), the noise immunity of the circuit is reduced. Dual polarity programming pulses (±28 volts) are required, and the programming occurs in two steps, erase and program. The capacitor ratios would have to be carefully controlled to avoid influencing the other NMOS transistor when programming the first transistor. Thus, the Tokushige et al. memory unit appears to be of significant complexity, both in terms of construction and operation.

U.S. Pat. No. 4,132,904 (Harari) discloses a volatile/nonvolatile logic latch circuit in which a pair of circuit branches each comprise a field effect transistor and a floating gate field effect transistor connected in series. The control gates of the respective floating gate transistors are cross-coupled to the respective junctions between the series transistors in the other circuit branch. The Harari circuit not only can be programmed to assume a desired state when the circuit is turned on, but it also can be intentionally overridden so as to store complementary data.

Other nonvolatile memory devices are disclosed in U.S. Pat. Nos. 3,618,053; 4,102,348; 4,185,319; 4,207,615; 4,228,527; 4,357,685; 4,363,110; 4,387,444; and 4,408,303. However, these memory devices suffer from various disadvantages, such as requirements for sense amplifiers, complexity in fabrication, high cell count, and poor noise immunity.

It is an object of the present invention to provide a nonvolatile latch circuit which assumes the proper state when power is applied to the circuit, irrespective of the power-applying conditions, and which automatically insures against intentional or unintentional overriding.

It is a further object of the invention to provide a latch circuit which requires a minimal amount of support circuitry, such as sense amplifiers.

It is another object of the invention to provide a latch circuit which minimizes the electrical power required for circuit operation.

It is yet another object of the invention to provide a nonvolatile latch circuit having low power requirements, small cell size, high noise immunity and good data retention.

SUMMARY OF THE INVENTION

In accordance with the foregoing objects, a nonvolatile semiconductor memory unit is provided having first and second circuit branches coupled in parallel. First and second metal-oxide-semiconductor field effect transistor (MOSFET) devices are respectively disposed in the first and second circuit branches. The respective gate of each MOSFET device is cross-coupled to the respective drain of the other MOSFET device. First and second floating gate MOSFET devices, each having a control gate and an insulated floating gate, are respectively disposed in the first and second circuit branches with their source and drain coupled in series with the source and drain of the respective first and second MOSFET devices. A first charging circuit coupled to the floating gate of the first floating gate MOSFET device is adapted to place either a net positive or a net negative charge on the floating gate of that floating gate MOSFET device so that the device is selectively operable in the depletion mode or in the enhancement mode. A second charging circuit coupled to the floating gate of the second floating gate MOSFET device is adapted to place either a net positive or a net negative charge on the floating gate of that floating gate MOSFET device so that the device is selectively operable in the enhancement mode or in the depletion mode. Data input circuitry is coupled to the charging circuits and to the control gates of the first and second floating gate MOSFET devices.

BRIEF DESCRIPTION OF THE DRAWINGS

The various objects, features and advantages of the invention will be readily appreciated by persons skilled in the art from the following detailed description when read in conjunction with the accompanying drawings wherein.

DETAILED DESCRIPTION OF THE INVENTION

The purpose of the nonvolatile latch is to store data, and to retain that data if power is interrupted. Moreover, the latch will assume the correct state regardless of the power-applying conditions.

Figure 1A:
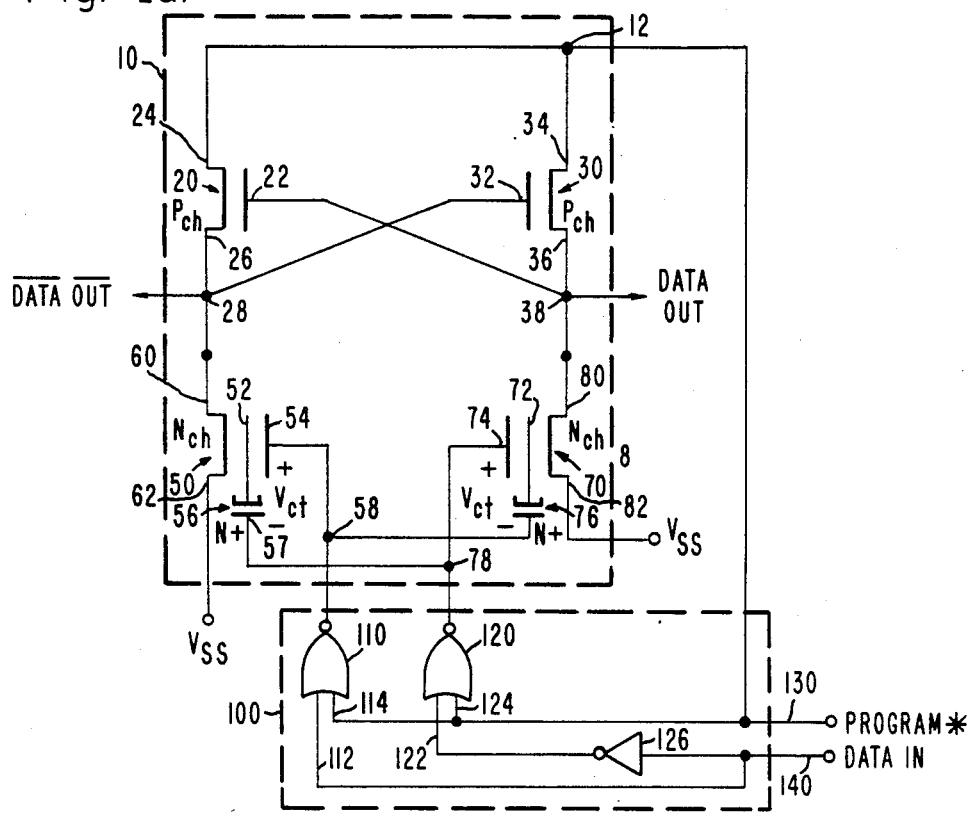
FIG. 1a is a schematic drawing of a preferred embodiment of the invention, with a programming circuit added so that the composite circuit emulates a"D" type flip-flop, as schematically represented in FIG. 1b.
Figure 1B:
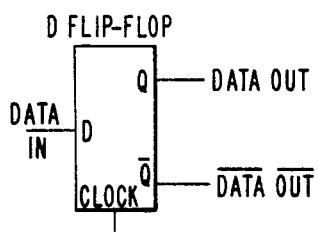

Referring to FIG. 1a, a preferred embodiment of the latch circuit is illustrated, including external circuitry to form a nonvolatile "D" type flip-flop, as represented in FIG. 1b. This is but one use of the invention, and other applications will be readily apparent to those skilled in the art. The preferred embodiment is particularly adapted to fabrication using CMOS technology, although the invention can be implemented by other technologies.

Latch 10 comprises four interconnected MOS transistors 20, 30, 50 and 70. Transistors 20, 30 comprise CMOS P-channel field effect transistors (FET). The sources 24, 34 of transistors 20, 30 are coupled together at a node 12. The gate 22 of transistor 20 is coupled to the drain 36 of transistor 30 at a node 38. Similarly, the gate 32 of transistor 30 is coupled to the drain 26 of transistor 20 at a node 28. As is well known, the P-channel transistors 20, 30 are turned on when their respective gates are at a low supply potential $V_{SS}$, but are turned off when their respective gates are at a high supply voltage $V_{DD}$.

Transistors 50, 70 comprise floating gate N-channel MOSFETs. Respective capacitors 56, 76 couple the respective floating gates 52, 72 of the respective transistors 50, 70 to respective N+ type regions 57, 77 formed in the cell substrate. These capacitors comprise tunnel oxide capacitances formed by the floating gate and N+ regions separated by a thin oxide layer. The N+ region 57 of transistor 50 is coupled to the gate 74 of transistor 70 at a programming node 78. Similarly, the N+ region 77 of transistor 70 is coupled to the gate 54 of transistor 50 at a programming node 58. It is to be understood that floating gate transistor technology is well known in the art, as described, for example, in the aforementioned U.S. Pat. No. 4,132,904.

The drain 26 of P-channel transistor 20 is connected to the drain 60 of N-channel transistor 50 at node 28. Similarly, the drain 36 of P-channel transistor 30 is connected to the drain 80 of N-channel transistor 70 at node 38. The respective sources 62, 82 of the transistors 50, 70 are respectively connected to the low voltage supply $V_{SS}$. In the preferred embodiment, the stored data DATA OUT is read from the memory unit at node 38, and the inverse of the stored data, $\overline{\text{DATA}}$ $\overline{\text{OUT}}$ is read from node 28.

Programming circuit 100 comprises NOR gates 110, 120, and inverter 126. The input signals to programming circuit 100 comprise "PROGRAM*" and "DATA IN". In the read mode of the memory unit, PROGRAM* is set to high supply voltage $V_{DDR}$, which is typically about +5 volts. During the programming mode, PROGRAM* is set to the "low" level, i.e., the low supply potential $V_{SS}$, which may be 0 volts, for example. The value of the DATA IN signal during the programming mode, when PROGRAM* is "low", establishes the data value to be stored by the latch. For programming a "low" voltage level at node 38, DATA IN is set to the "low" supply potential $V_{SS}$. For programming a "high" voltage level at node 38, DATA IN is set to a potential $V_{DDP}$ which is higher than the potential $V_{DDR}$ used during the read mode, so that the potential difference between $V_{DDP}$ and $V_{SS}$ is typically more than 12 volts in the preferred embodiment, as will be described in more detail below.

It will be appreciated that, when the PROGRAM* signal is at $V_{DDR}$ during the read mode, the programming circuit 100 will provide the voltage $V_{SS}$ to both programming nodes 58, 78 and will apply the voltage $V_{DDR}$ to node 12. This results from the fact that the NOR gates 110, 130 require both input signals to be "low" to obtain a "high" output signal. Therefore, with PROGRAM* at the "low" level, the NOR gate outputs will be "low" regardless of the value of DATA IN.

During the programming mode, with PROGRAM* at the "low" state, ie., $V_{SS}$, the programming circuit 100 will provide a "low" voltage potential $V_{SS}$ to node 12, and will provide complementary programming signals to programming nodes 58, 78. The respective values of the programming signals depends upon the value of DATA IN. Thus, when DATA IN equals $V_{DDP}$, $V_{DDP}$ appears at the output of NOR gate 110 and is applied to programming node 58. In this event, the complementary programming signal at the output of NOR gate 120 is at the "low" state and is applied to programming node 78. Conversely, when DATA IN is at the "low" level, the values of the respective programming signals are inverted, i.e., $V_{DDP}$ is applied to programming node 78, and $V_{SS}$ is applied to node 58.

Figure 2:
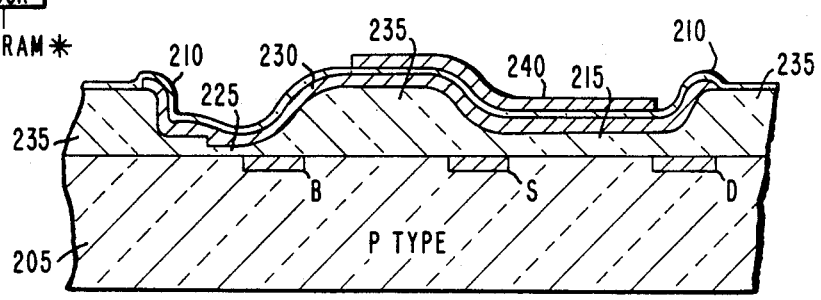
FIG. 2 is a cross-sectional view illustrative of the structure of the floating gate transistors with tunnel oxide capacitors utilized in the preferred embodiment.

The simplified structural configuration of a floating gate N-channel transistor and the N+ region as used in the preferred embodiment is shown in FIG. 2. The construction of floating gate N-channel CMOS transistors is well known to those skilled in the art, and need not be described in great detail. Region 205 comprises P-type silicon in which highly doped N+ regions B, S, D form respectively, one side of tunnel oxide capacitance $C_t$, the source S, and the drain D. N+ region B does not form a part of the N-channel FET, its function being to form one side of the tunnel oxide capacitor. Transistor gate 240 comprises a conductive layer. Insulation layer 210 separates the floating gate 230 from gate 240. Field oxide regions 235, tunnel oxide layer 225, and gate oxide layers 215 separate the floating gate 230 from region 205.

Floating gate 230 is a conductive layer formed of polycrystalline N-type silicon, which is conductive at all times. Floating gate 230 is disposed adjacent the N+ region B. The tunnel oxide layer 225 between the floating gate and the top surface of region 205 adjacent N+ region B is substantially thinner than the gate oxide region 215 between the floating gate and the channel region of the transistor. The field oxide region 235 is substantially thicker than the gate oxide layer 215. Depending upon the particular technology with which the latch is fabricated, the N+ region B may be disposed directly beneath the tunnel oxide layer 225, rather than adjacent to the area beneath the tunnel oxide.

The floating gate 230, the tunnel oxide layer 225, and the N+ region B form a tunnel oxide capacitor $C_T$. Since the gate 240 is separated from the floating gate 230 by insulating layer 210, an effective capacitor C1 is formed. Similarly, an effective capacitor C2 is formed between floating gate 230 and region 205, which are separated by the oxide regions 215, 225 and 235. The N-channel floating gate FET illustrated in FIG. 2 requires a gate bias threshold potential $V_T$ to "turn on" the transistor, i.e., to allow significant current flow between the source S and the drain D.

When a "high" programming signal $V_{DDP}$ is applied to a programming node, and the N+ region is connected to $V_{SS}$, a voltage $V_{CT}$ is applied across the tunnel oxide capacitor $C_T$, $V_{CT}$ having a magnitude equivalent to $KV_{DDP}$, where K is a coupling coefficient. The value of K is equivalent to the value $C_1/(C_1+C_2)$. Thus, for the polarity of $V_{CT}$ shown in FIG. 1a, i.e., measured from the floating gate to the N+ region, application of the complementary programming signals $V_{DDP}$ to the gate of an N-channel transistor and $V_{SS}$ to the N+ region B of the transistor results in a voltage $V_{CT}$ equivalent to $+KV_{DDP}$ across the tunnel oxide capacitance. The converse situation, with $V_{SS}$ applied to the gate and $V_{DDP}$ to the N+ region B, results in a voltage $V_{CT}$ equivalent to $-KV_{DDP}$. As a result of the selection of the fabrication parameters defining C1 and C2, the coefficient K typically has a value of 0.8 in the preferred embodiment.

During the programming mode, the voltage $V_{DDP}$ causes tunneling of carriers through the tunnel oxide capacitance. The population of carriers transferred through tunneling is proportional to $V_{CT}[\log(\text{programming time})]$. Thus, to decrease the required programming time, i.e., the time the device must remain in the programming mode to program the device to the desired state, the level of $V_{DDP}$ may be increased. In the preferred embodiment, the potential difference between $V_{DDP}$ and $V_{SS}$ typically exceeds +12 volts.

It will be apparent to those skilled in the art that when $+KV_{DDP}$ is applied across the tunnel oxide capacitor, electron carriers will tunnel through the oxide layer 225 from the N+ region B to the floating gate 230. This will result in a net negative charge on the floating gate 230 which will remain when $V_{CT}$ is brought to zero. This negative charge will shift the normal threshold voltage of the N-channel transistor as seen from the gate 240 to a more positive threshold, well into the enhancement mode.

Conversely, when a negative voltage $-KV_{DDP}$ is applied across the tunnel oxide capacitor $C_T$, electrons tunnel from the floating gate 230 to the N+ region B. This decrease in the electron carrier density in the floating gate will remain after $V_{CT}$ is brought to zero. The resultant net positive charge on the floating gate will shift the threshold voltage in a negative direction, well into the depletion mode, i.e., with the device being turned on even with zero gate bias.

During the read mode, it may be seen that the voltage applied across the tunnel oxide capacitor is zero, facilitating data retention. The tunneling effect is negligible, leading to very long retention times (on the order of ten years or longer), since no voltage is applied across the tunnel oxide capacitor, and the devices remain programmed to their respective depletion and enhancement states.

As described, an N-channel transistor having $V_{DDP}$ applied to its gate is programmed to a positive threshold voltage $V_T$ (enhancement). In the enhancement mode, a positive external voltage must be applied to the gate to turn the transistor on; with its gate at $V_{SS}$, the transistor will be turned off. The N-channel device with the $V_{SS}$ level voltage applied to its gate is programmed to a negative threshold voltage (depletion); with its gate grounded, the transistor will be turned on.

Figure 3:
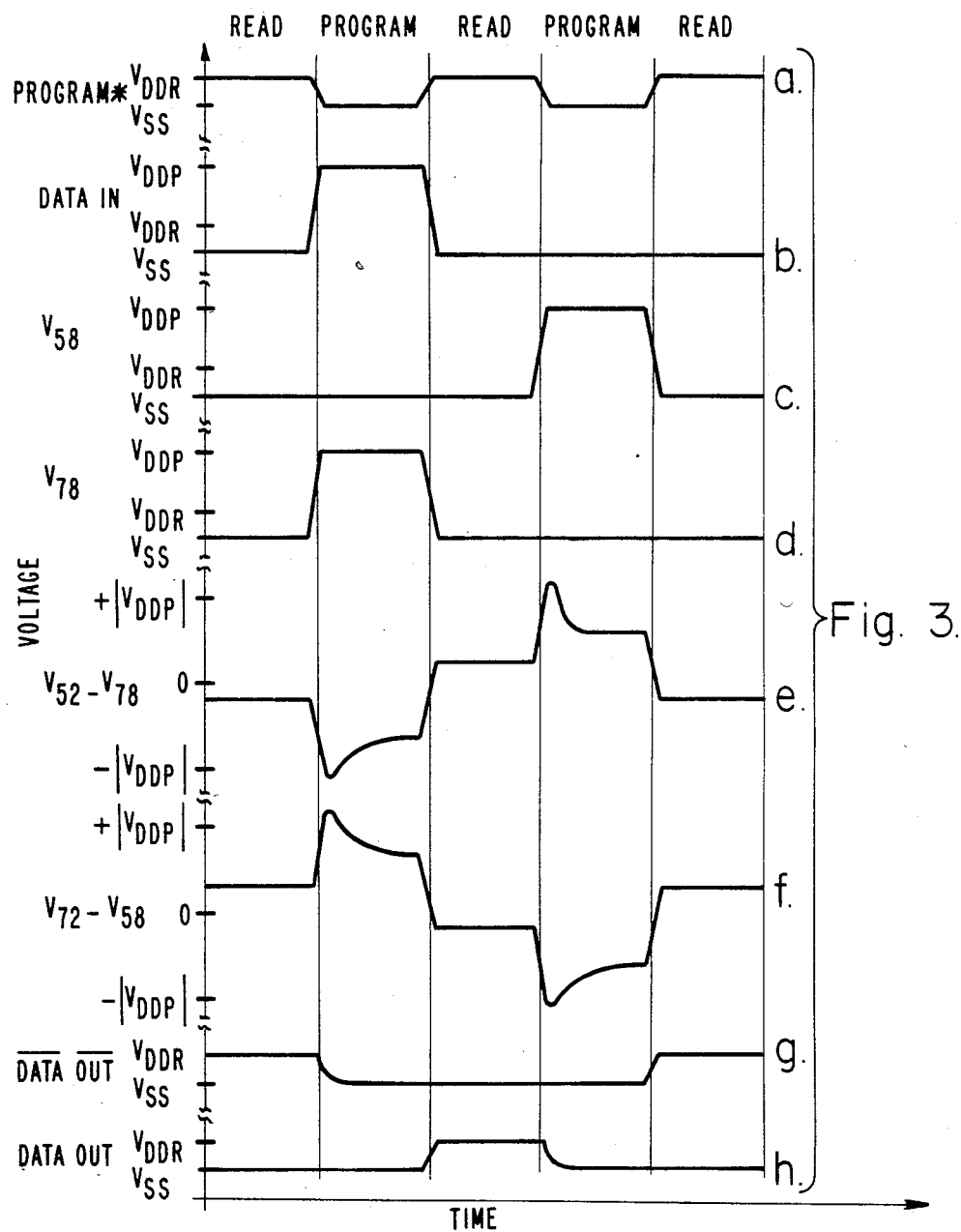
FIGS. 3(a–h) show waveforms of the voltage at various points in the circuit of FIG. 1a as a function of time.

As may be seen with reference to the waveforms of FIGS. 3(a–h), during the read mode, PROGRAM* is at $V_{DDR}$. This forces both N-channel gates 54, 74 and N+ regions 57, 77 to $V_{SS}$. During the proramming mode, when PROGRAM* is brought to $V_{SS}$, and DATA IN at $V_{DDP}$ (logic "1"), gate 74 of the transistor 70 and the N+ region 57 of the transistor 50 are driven to $+V_{DDP}$. The gate 54 of the transistor 50 and the N+ region 77 of the transistor 70 are driven to $V_{SS}$. Also, since PROGRAM* is applied to node 12, the memory unit does not draw any current during the programming mode. A voltage equal in magnitude to $KV_{DDP}$ is therefore placed across the tunnel oxide layer of each transistor, the polarity of the voltage applied to the two N-channel transistors 50, 70 being complementary as discussed above.

During the read mode, when PROGRAM* is at $V_{DDR}$, the memory unit is energized and both N-channel gates 54, 74 are brought to $V_{SS}$. The depletion N-channel transistor will be turned on, the enhancement N-channel transistor will be turned off, and the memory unit will assume its only stable state. If transistor 50 is in the depletion mode (DATA IN is at $V_{DDP}$ during the programming mode), it will be turned on during the read mode, and the transistor 70, in the enhancement mode, will be turned off. The DATA OUT node 38 will be pulled to $V_{DDR}$ by conducting transistor 30, which is turned on, since its gate is coupled to the drain of conductive transistor 50 and, therefore, is at the $V_{SS}$ potential. Transistor 20 will be turned off, since its gate is coupled to node 38, and the $\overline{\text{DATA OUT}}$ node 28 will be driven to $V_{SS}$. Since transistors 20 and 70 are both turned off, no dc current is drawn during the read mode.

If DATA IN is at $V_{SS}$ (logic "0") during the programming mode, then the voltage levels and transistor states are inverted from that described above. Transistors 30 and 50 will be turned off, DATA OUT will be at $V_{SS}$ (logic "0"), and $\overline{\text{DATA OUT}}$ will be at $V_{DDR}$ (logic "1").

The preferred embodiment of the invention draws no dc current and assumes the correct state during both fast and slow power-applying conditions. The memory unit cannot be "flipped" by setting it to the wrong state, illustrating the high noise immunity of the circuit. Very small supply voltages (for example, thirteen volts at one milliseconds) are able to program the unit.

The preferred embodiment stores one bit of data nonvolatily, and does not require external sensing amplifiers to help drive the circuit into the correct state. The circuit provides output logic signals, i.e., either at $V_{DDR}$ or $V_{SS}$, whenever power is applied. The latch may be fabricated efficiently, using the same technology as used to construct other elements of the device such as the EEPROM in which the latch is incorporated.

While the invention has been described in the context of a "D" type flip-flop memory cell, the invention may be readily adapted to many other applications requiring a nonvolatile memory. For example, the invention can be adapted to such applications as nonvolatile counters or coded security devices requiring that a predetermined code be entered into the device to allow entry (such as garage door openers).

It is understood that the above-described embodiment is merely illustrative of but one of the many possible specific embodiments which can represent applications of the principles of the present invention. For example, the N- and P-channel devices may be reversed, such that the nonvolatile devices are P-channel floating gate devices, and the P-channel transistors of the preferred embodiment would be N-channel transistors. Polarity reversals would be required; for example, the programming circuit would be adapted to provide a voltage $V_{DDP}$ to the gates of the nonvolatile devices during the programming mode. Those skilled in the art will readily appreciate the various changes to the preferred embodiment when P-channel floating gate transistors are utilized as the nonvolatile devices.

Moreover, it is to be understood that the programming circuit utilized in the preferred embodiment is merely illustrative. Many other circuits can be devised to program the latch, including circuits which program the latch in two or more steps. Thus, for example, either the gates of the nonvolatile devices or the N+ regions could be connected together, with the N+ regions or gates which are not connected together forming two additional programming nodes. In the first programming step, the connected nodes are brought to a high potential, and the additional two programming nodes are forced to a low potential, to program both nonvolatile devices into the same state. In the second programming step, the second and third proramming nodes are driven by complementary programming signals to reverse the state of one nonvolatile device.

Numerous and varied other arrangements can be readily devised in accordance with these principles by those skilled in the art without departing from the spirit and scope of the invention.

What is claimed is:

1. A nonvolatile semiconductor memory unit having first and second circuit branches coupled in parallel and comprising:
    first and second metal-oxide-semiconductor field effect transistors (MOSFET) devices respectively disposed in said first and second circuit branches, the respective gate of each MOSFET device being cross-coupled to the respective drain of the other of said MOSFET devices;
    first and second floating gate MOSFET devices, each having a control gate and an insulated floating gate, respectively disposed in said first and second circuit branches with their source and drain coupled in series with the source and drain of said respective first and second MOSFET devices;
    first charging means coupled to the floating gate of said first floating gate MOSFET device and adapted to place either a net positive or a net negative charge on said floating gate so that said first floating gate MOSFET device is selectively operable in the depletion mode or in the enhancement mode;
    second charging means coupled to the floating gate of said second floating gate MOSFET device and adapted to place either a net positive or a net negative charge on said floating gate so that said second floating gate MOSFET device is selectively operable in the enhancement mode or in the depletion mode; and
    data input means coupled to said first and second charging means and said control gates of said first and second floating gate MOSFET devices.

2. The memory unit of claim 1 wherein said first and second charging means each comprise a thin dielectric region disposed adjacent to the respective floating gate of said first and second floating gate MOSFET devices and wherein, during a memory unit programming mode, each of said charging means is adapted to provide a potential difference across said thin dielectric region, and the direction of carrier tunneling is dependent upon the polarity of said potential difference.

3. The memory unit of claim 2 wherein each of said charging means further comprises a semiconductor region adjacent said thin dielectric region, said semicondutor region being adapted to supply charge carriers.

4. The memory unit of claim 3 wherein each of the control gates of said floating gate MOSFET devices is respectively cross-coupled to the respective semiconductor region of the charging means coupled to the other of said floating gate MOSFET devices.

5. The memory unit of claim 2 wherein said first and second branches are connected together at the sources of said first and second MOSFET devices, and wherein said memory unit further comprises programming means adapted to bring said sources of said first and second MOSFET devices to substantially the same voltage as the sources of said first and second floating gate MOSFET devices during said memory unit programming mode, whereby substantially no dc current flows through said first and second circuit branches during said programming mode.

6. The memory unit of claim 1 wherein said first and second MOSFET devices comprise P-channel MOSFET devices, and said first and second floating gate MOSFET devices comprise N-channel floating gate MOSFET devices.

7. The memory unit of claim 1 wherein said first and second MOSFET devices comprise N-channel MOSFET devices, and said first and second floating gate MOSFET devices comprise P-channel floating gate MOSFET devices.

8. A MOS nonvolatile semiconductor memory cell having first and second circuit branches coupled in parallel and comprising:
    first and second P-channel metal-oxide-semiconductor field effect transistor (MOSFET) devices respectively disposed in said first and second circuit branches, the respective gate of each P-channel MOSFET device being cross-coupled to the respective drain of the other of said P-channel MOSFET devices;
    first and second N-channel floating gate MOSFET devices, each having a control gate and an insulated floating gate, respectively disposed in said first and second circuit branches with their source and drain coupled in series with said respective first and second P-channel MOSFET devices;
    first charging means coupled to the floating gate of said first N-channel MOSFET device and adapted to place either a net positive or a net negative charge on said floating gate so that said first N-channel MOSFET device is selectively operable in the depletion mode or in the enhancement mode;

second charging means coupled to the floating gate of said second N-channel MOSFET device and adapted to place either a net positive or a net negative charge on said floating gate so that said second N-channel MOSFET device is selectively operable in the enhancement mode or in the depletion mode; and data input means coupled to said first and second charging means and said first and second floating gate MOSFET devices.

9. The memory cell of claim 8 wherein each of said charging means comprises: thin insulator means disposed adjacent the floating gate of the respective N-channel device, and an N+ semiconductor region disposed adjacent said insulator means, whereby each of said charging means comprises a tunnel capacitor formed by said floating gate, said thin insulator means, and said N+ semiconductor region.

10. The memory cell of claim 9 wherein said first and second charging means are adapted such that a potential difference is developed between said respective floating gates and said respective N+ regions so as to induce charge carrier tunneling through said respective tunnel capacitor.

11. The memory cell of claim 10 wherein the respective control gates of said first and second N-channel MOSFET devices are cross-coupled to the respective N+ semiconductor regions of said tunnel capacitor means coupled to the floating gate of the other N-channel MOSFET device.

* * * * *